(12) United States Patent
Naik et al.

(10) Patent No.: US 12,417,933 B2
(45) Date of Patent: Sep. 16, 2025

(54) WAFER FAR EDGE TEMPERATURE MEASUREMENT SYSTEM WITH LAMP BANK ALIGNMENT

(71) Applicant: ASM IP Holding B.V., Almere (NL)

(72) Inventors: Rutvij Naik, Tempe, AZ (US); Shujin Huang, Tempe, AZ (US); Junwei Su, Tempe, AZ (US); Xing Lin, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 773 days.

(21) Appl. No.: 17/697,164

(22) Filed: Mar. 17, 2022

(65) Prior Publication Data

US 2022/0301906 A1  Sep. 22, 2022

Related U.S. Application Data

(60) Provisional application No. 63/270,668, filed on Oct. 22, 2021, provisional application No. 63/162,878, filed on Mar. 18, 2021.

(51) Int. Cl.
*H01L 21/67* (2006.01)
*H05B 31/00* (2006.01)
*G01J 5/0806* (2022.01)

(52) U.S. Cl.
CPC ... *H01L 21/67248* (2013.01); *H05B 31/0081* (2013.01); *G01J 5/0806* (2013.01)

(58) Field of Classification Search
CPC ........ G01J 5/0007; G01J 5/026; G01J 5/0806; G01J 5/084; G01J 5/0846; H01L 21/67115; H01L 21/67248; H05B 31/0081

(Continued)

(56) References Cited

U.S. PATENT DOCUMENTS

| 5,155,336 A | 10/1992 | Gronet |
| 5,231,595 A | 7/1993 | Makino et al. |

(Continued)

FOREIGN PATENT DOCUMENTS

| JP | 2010062197 A | 3/2010 |
| TW | 201415541 A | 4/2014 |

OTHER PUBLICATIONS

Wessapan, Teerapot, et al., "Temperature induced in human organs due to near-field and far-field electromagnetic exposure effects". International Journal of Heat and Mass Transfer 119 (2018) 65-76.

(Continued)

*Primary Examiner* — Sang Y Paik
(74) *Attorney, Agent, or Firm* — Snell & Wilmer L.L.P.

(57) ABSTRACT

A reactor system designed to provide accurate monitoring of wafer temperatures during deposition steps. The reactor system includes a pyrometer mounting assembly supporting and positioning three or more pyrometers (e.g., infrared (IR) pyrometers) relative to the reaction chamber to measure a center wafer temperature and an edge wafer temperature as well as reaction chamber temperature. The pyrometer mounting assembly provides a small spot size or temperature sensing area with the edge pyrometer to accurately measure edge wafer temperatures. A jig assembly, and installation method for each tool setup, is provided for use in achieving accurate alignment of the IR pyrometer sensing spot (and the edge pyrometer) relative to the wafer, when the pyrometer mounting assembly is mounted upon a lamp bank in the reactor system or in tool setup. The wafer edge temperature sensing with the reactor system assembled with proper alignment ensures accurate and repeatable measurement of wafer temperatures.

20 Claims, 16 Drawing Sheets

(58) Field of Classification Search
USPC .......................................................... 219/201
See application file for complete search history.

(56) References Cited

U.S. PATENT DOCUMENTS

| | | | |
|---|---|---|---|
| 5,305,417 | A | 4/1994 | Najm et al. |
| 6,079,874 | A | 6/2000 | Hegedus |
| 6,348,420 | B1 | 2/2002 | Raaijmakers et al. |
| 6,492,625 | B1 | 12/2002 | Boguslavskiy et al. |
| 6,536,964 | B1 | 3/2003 | Kitano et al. |
| 6,596,973 | B1 | 7/2003 | Donald et al. |
| 6,799,137 | B2 | 9/2004 | Schietinger et al. |
| 7,651,956 | B1 | 1/2010 | Mercaldi et al. |
| 7,921,802 | B2 | 4/2011 | De |
| 7,964,038 | B2 | 6/2011 | Patalay et al. |
| 8,895,395 | B1 | 11/2014 | Kerber et al. |
| 8,969,934 | B1 | 3/2015 | Cheng et al. |
| 9,034,770 | B2 | 5/2015 | Park et al. |
| 9,093,269 | B2 | 7/2015 | Cody et al. |
| 9,093,390 | B2 | 7/2015 | Wang et al. |
| 9,299,557 | B2 | 3/2016 | Tolle et al. |
| 9,474,163 | B2 | 10/2016 | Tolle et al. |
| 9,512,520 | B2 | 12/2016 | Sanchez et al. |
| 9,514,927 | B2 | 12/2016 | Tolle et al. |
| 9,570,298 | B1 | 2/2017 | Basker et al. |
| 9,576,788 | B2 | 2/2017 | Liu et al. |
| 9,757,878 | B2 | 9/2017 | Feuilloley et al. |
| 9,887,096 | B2 | 2/2018 | Park et al. |
| 9,905,420 | B2 | 2/2018 | Margetis et al. |
| 10,373,850 | B2 | 8/2019 | Tolle et al. |
| 10,519,541 | B2 | 12/2019 | Tolle et al. |
| 10,566,187 | B2 | 2/2020 | Qian et al. |
| 11,227,959 | B2 | 1/2022 | Siegmund et al. |
| 2003/0119283 | A1 | 6/2003 | Ishibashi et al. |
| 2007/0015360 | A1 | 1/2007 | Lu et al. |
| 2007/0212510 | A1 | 9/2007 | Hieslmair et al. |
| 2008/0090193 | A1 | 4/2008 | Soanes |
| 2009/0101633 | A1 | 4/2009 | Aggarwal et al. |
| 2010/0133257 | A1* | 6/2010 | Sorabji ............ H01L 21/67115 219/447.1 |
| 2011/0149062 | A1* | 6/2011 | Campidell ............ G01J 5/0003 356/51 |
| 2011/0205688 | A1 | 8/2011 | Ray et al. |
| 2011/0266252 | A1 | 11/2011 | Thadani et al. |
| 2011/0299898 | A1 | 12/2011 | Ito et al. |
| 2012/0160828 | A1 | 6/2012 | Bowman et al. |
| 2012/0237695 | A1 | 9/2012 | Pye et al. |
| 2012/0270384 | A1 | 10/2012 | Sanchez et al. |
| 2013/0052333 | A1 | 2/2013 | Lindow et al. |
| 2013/0171350 | A1 | 7/2013 | Kraus et al. |
| 2015/0184313 | A1 | 7/2015 | Yoshitake et al. |
| 2015/0217517 | A1 | 8/2015 | Karpas et al. |
| 2015/0330837 | A1 | 11/2015 | Liberti et al. |
| 2016/0027671 | A1 | 1/2016 | Ranish et al. |
| 2016/0068955 | A1 | 3/2016 | Brillhart et al. |
| 2016/0133504 | A1 | 5/2016 | Chu |
| 2017/0074727 | A1 | 3/2017 | Liu et al. |
| 2017/0074737 | A1 | 3/2017 | Hamabe et al. |
| 2017/0178917 | A1 | 6/2017 | Kamp et al. |
| 2017/0278761 | A1 | 9/2017 | Devilliers |
| 2018/0182597 | A1 | 6/2018 | Blomberg et al. |
| 2018/0195174 | A1 | 7/2018 | Kim et al. |
| 2019/0027605 | A1 | 1/2019 | Tolle et al. |
| 2019/0123174 | A1 | 4/2019 | Mochizuki et al. |
| 2019/0127851 | A1 | 5/2019 | Lau et al. |
| 2019/0185990 | A1 | 6/2019 | Zhao |
| 2019/0333793 | A1 | 10/2019 | Tolle et al. |
| 2020/0115800 | A1 | 4/2020 | Ohkawa |
| 2020/0118336 | A1 | 4/2020 | Oyanagi et al. |
| 2020/0203149 | A1 | 6/2020 | Huang et al. |
| 2020/0294794 | A1 | 9/2020 | Haberecht et al. |
| 2021/0125853 | A1 | 4/2021 | Rathi et al. |
| 2021/0257260 | A1 | 8/2021 | Chu et al. |
| 2021/0366722 | A1 | 11/2021 | Lei et al. |
| 2022/0386417 | A1* | 12/2022 | Taniguchi ............ H05B 1/0233 |

OTHER PUBLICATIONS

Brar, Victor W., et al., "Electronic modulation of infrared radiation in graphene plasmonic resonators". Nature Communications, 6:7032, May 2015, pp. 1-7.

Zhao, Zengyue. et al., "Selectively thermal radiation control in long-wavelength infrared with broadband all-dielectric absorber". Optics Express, vol. 27, No. 24/25, Nov. 2019, 35088-35095.

Nycz, Andrzej, et al., "Controlling substrate temperature with infrared heating to improve mechanical properties of large-scale printed parts". Additive Manufacturing 33 (2020) 101068, pp. 1-10.

Zhang, Xia, et al., "Controlling Thermal Emission by Parity-Symmetric Fano Resonance of Optical Absorbers in Metasurfaces." ACS Photonics 2019, 6, 2671-2676.

Khan, Shahrukh, et al., "Comparative accuracy testing of non-contact infrared thermometers and temporal artery thermometers inan adult hospital setting". American Journal of Infection Control 49 (2021) 597-602.

Chou, Ming-Dah, et al., "A Parameterization of the Effective Layer Emission for Infrared Radiation Calculations". Journal of the Atmospheric Sciences, vol. 62, Feb. 2005, pp. 531-541.

* cited by examiner

WAFER FAR EDGE TEMPERATURE MEASUREMENT SYSTEM WITH LAMP BANK ALIGNMENT

CROSS-REFERENCE TO RELATE APPLICATIONS

This application claims priority to and the benefit of U.S. Provisional Patent Application No. 63/162,878, filed Mar. 18, 2021 and entitled "FILM DEPOSITION SYSTEMS AND METHODS," and U.S. Provisional Patent Application No. 63/270,668, filed Oct. 22, 2021 and entitled "WAFER FAR EDGE TEMPERATURE MEASUREMENT SYSTEM WITH LAMP BANK ALIGNMENT," which are hereby incorporated by reference herein to the extent that they do not conflict with the present disclosure.

FIELD OF THE DISCLOSURE

The present disclosure relates generally to methods and systems for monitoring wafer temperatures in a semiconductor processing or reactor system, and, more particularly, to methods and apparatus for monitoring far edge temperatures of wafers in semiconductor processing or reactor systems, with a design to ensure accurate assembly of a reactor system including accurate, repeatable placement of its lamp bank for edge temperature monitoring.

BACKGROUND OF THE DISCLOSURE

Semiconductor processing, including chemical vapor deposition (CVD), is a well-known process for forming thin films of materials on substrates, such as silicon wafers. In a CVD process, for example, gaseous molecules of the material to be deposited are supplied to substrates to form a thin film of that material on the substrates by chemical reaction. Such formed thin films may be polycrystalline, amorphous, or epitaxial. Typically, CVD processes are conducted at elevated temperatures to accelerate the chemical reaction and to produce high quality films, with some of these processes, such as epitaxial silicon deposition, being conducted at extremely high temperatures (e.g., greater than 900° C.).

To achieve the desired temperatures, wafers (or substrates) are heated using resistance heating, induction heating, or radiant heating. Since radiant heating is the most efficient technique, it is presently the favored method for many types of deposition processes including CVD processes. Radiant heating generally involves positioning infrared lamps around a reaction chamber or reactor containing the substrate upon which material is to be deposited. One problem, though, with use of radiant heat is that, in some reactors, the lamps can create nonuniform temperature distributions on the substrate surface, such as localized hot spots, due to the localized nature of the lamps, focusing effects, and interference effects.

During a typical CVD process, one or more substrates are placed on a substrate support (e.g., a susceptor) inside a chamber within the reactor. Both the substrate and the substrate support are heated to a desired temperature. In a typical substrate treatment step, reactant gases are passed over the heated substrate causing deposition of a thin layer of a desired material on the substrate surface. If the deposited layer has the same crystallographic structure as an underlying silicon surface, the deposited layer is called an epitaxial layer (or a monocrystalline layer because it has only one crystal structure). Through subsequent processes, these layers may be used to form a semiconductor device, such as an integrated circuits.

To ensure high quality layers during CVD and other deposition processes, various process parameters must be carefully controlled, with the temperature of the substrate during each treatment step being one of the more critical. During CVD, for example, the substrate temperature dictates the rate of material deposition on the wafer because the deposition gases react at particular temperatures and deposit on the substrate. If the temperature varies across the surface of the substrate, uneven deposition of the film may occur and the physical properties in the film may not be uniform over the substrate surface. Furthermore, in epitaxial deposition, even slight temperature nonuniformity can result in undesirable crystallographic slip. In the semiconductor industry, it is important that the material be deposited uniformly thick with uniform properties over the wafer, as the wafer is often divided into individual die having integrated circuits thereon. If a CVD process or other deposition step produces deposited layers with nonuniformities, semiconductor devices formed on different die may have inconsistent operational characteristics or may fail altogether.

FIG. 1 illustrates a convention arrangement for CVD and other deposition processes within a reaction chamber 100. As shown, a wafer 110 is located on a susceptor 120, with its edges supported by and in abutting contact with the susceptor ledge 122. During epitaxial growth, for example, the wafer 110 and the susceptor 120 are heated up by thermal radiation. Since the contact area between the wafer edge and susceptor ledge 122 is at the far edge of the wafer 110, the temperature distribution is typically nonuniform with the center wafer temperature, T-Wafer Center, differing from the wafer edge temperature, T-Wafer Edge. If such a temperature gradient is large enough, it will greatly impact the quality of a grown epitaxial film such as by producing slip defects and achieving poor thickness or resistivity uniformity. Hence, there is a demand for a methodology to accurately measure and control wafer temperatures including those at the wafer far edge during epitaxial growth and other deposition processes.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Disclosed herein, according to various embodiments, is a reactor system or apparatus for use in semiconductor processing such as chemical vapor deposition (CVD) and other deposition steps. The reactor system is designed to provide accurate monitoring of substrate (e.g., a wafer) temperatures during deposition steps. More specifically, the reactor system includes a pyrometer mounting assembly adapted to support and position three or more pyrometers (e.g., infrared (IR) pyrometers) relative to the reaction chamber to measure a center wafer temperature and a wafer edge temperature as well as reaction chamber temperature. The pyrometer mounting assembly is configured to provide a small spot size (or temperature sensing area) with the edge pyrometer to assist in far-edge wafer temperature measurement.

Additionally, a jig assembly, and associated assembly method, is provided for use in achieving accurate alignment of the IR pyrometer sensing spot (or the edge pyrometer)

relative to the wafer, when the pyrometer mounting assembly is mounted upon a lamp bank in the reactor system or in each tool setup. The wafer far edge temperature sensing techniques described herein ensure the accurate and repeatable measurement of wafer temperatures and associated process control using monitored temperatures.

In some exemplary embodiments, a method is presented for assembling a reactor system adapted for monitoring edge wafer temperatures. The method may include placing a lamp bank, operable to provide heat to an inner chamber of reaction chamber, on a lid adapted for supporting the lamp bank relative to the reaction chamber. The method may continue with mounting an alignment jig on an upper surface of the lamp bank at a location predefined for an edge pyrometer of a temperature monitoring assembly operable to perform the monitoring of the edge wafer temperatures. Further, the method may include placing an edge sensor, operable to sense an edge of a wafer positioned on a susceptor in the inner chamber, in the alignment jig. Then, the method may involve moving the lamp bank linearly relative to the lid, with the edge sensor operating, until an edge of the wafer is identified, and then securing the lamp bank to the lid. The edge sensor may be a fiber optic sensor, and the edge of the wafer is identified based on a difference in reflectivity of the wafer and the susceptor.

In these or other embodiments, the method may further include removing the jig from the lamp bank and replacing the jig with the temperature monitoring assembly with the edge pyrometer positioned at the location predefined for the edge pyrometer. In such cases, the lamp bank may include a transmission channel at the location predefined for the edge pyrometer to receive a signal from the wafer on the susceptor from the inner chamber through the lamp bank at the edge pyrometer. In such implementations, the jig may include a slot for receiving the edge detector that is offset a predefined distance from the transmission channel when the jig is mounted on the upper surface of the lamp bank at the location predefined for the edge pyrometer.

Further, the upper surface of the lamp bank may include a pair of alignment holes on opposite sides of the transmission channel, wherein the jig comprises a body with a bottom surface for mating with the upper surface of the lamp bank. The jig then includes a pair of alignment pins sized and positioned for insertion into the alignment holes on the lamp bank, and the lamp bank further includes a second transmission channel with a center offset the predefined distance from the transmission channel, whereby a signal to the edge sensor is transmitted from the inner chamber and through the lamp bank. For example, the predefined distance may be in the range of 2 to 10 millimeters, with some implementations using a range of 4 to 6 millimeters, with 5 millimeters used in one prototype. In these or other implementations, the placing of the lamp bank includes positioning the lamp bank equidistantly from inner edges of the lid along an axis that is orthogonal to an axis along which the lamp bank is moved during the moving of the lamp bank linearly relative to the lid.

In various other embodiments, a reactor system is described that is adapted for monitoring edge wafer temperatures. The system includes a reaction chamber, and a lid for supporting heat lamps relative to the reaction chamber. Further, the system includes a lamp bank positionable or slidable on the lid in a plurality of positions along a longitudinal axis (e.g., the X and/or Y axis of a square or rectangular lid). Significantly, the system also includes an alignment jig mounted upon an upper surface of the lamp bank at a location predefined for an edge pyrometer of a temperature monitoring assembly operable to perform the monitoring of the edge wafer temperatures. The lamp bank includes a first transmission channel at the location predefined for the edge pyrometer for receiving a signal at the edge pyrometer from within the reaction chamber. The system further includes an edge sensor, operable to sense an edge of a wafer positioned on a susceptor in the reaction chamber, supported in a slot of the alignment jig. The edge sensor may be oriented by the slot in the alignment jig to receive a signal through a second transmission channel, offset a predefined distance from the first transmission channel, in the lamp bank into the reaction chamber.

The system may be configured in some embodiments such that, during assembly of the reactor system, the lamp bank is linearly movable between two or more of the plurality of positions with the edge sensor operating until the edge sensor identifies the edge of the wafer. In such embodiments, the edge sensor may include a fiber optic sensor and the edge of the wafer is identified based on a difference in reflectivity of the wafer and the susceptor. In these or other implementations, the upper surface of the lamp bank may include a pair of alignment holes on opposite sides of the first transmission channel. Then, the jig may include a body with a bottom surface for mating with the upper surface of the lamp bank, and the jig may further include a pair of alignment pins sized and positioned for insertion into the alignment holes on the lamp bank, whereby the signal from the edge sensor is transmitted through the lamp bank into the inner chamber during operations of the edge sensor.

In some cases, the system also includes, with the alignment jig removed from the lamp bank, a mounting stand as part of the temperature monitoring assembly that supports the edge pyrometer on the upper surface of the lamp bank with the edge pyrometer at the predefined location for the edge pyrometer, whereby a signal from the edge pyrometer is transmitted through the first transmission channel of the lamp bank onto a spot on the wafer proximate to the edge of the wafer. In these implementations, the spot generated on the wafer by the edge pyrometer may have an outer diameter in the range of 2 to 10 millimeters such 4 to 6 millimeters or the like (with one embodiment configured with hardware to produce a 6 millimeter OD spot or sensor area on an upper surface of a wafer received on the susceptor). The mounting stand can be configured to define a lens of the edge pyrometer with a length greater than a length of a lens of a center pyrometer of the temperature mounting assembly to define a size of the spot, and an outlet of the first transmission channel acts as a signal clipping aperture for the signal from the wafer and received at the edge pyrometer to further define the size of the spot on the wafer (or developing film thereon) from which the signal is received. Then, during operations of the system, the center pyrometer senses a temperature of the wafer at a center location of the wafer with a spot having an outer diameter greater than the spot of the edge pyrometer, whereby temperatures of the wafer are concurrently monitored at two or more locations.

In still other embodiments of the description, an alignment jig is presented that is adapted for aligning an edge pyrometer with a wafer edge in a reactor system. This jig may include a body and a slot extending through the body for receiving a fiber optic sensor. The alignment jig may further include a pair of alignment pins on a surface of the body, with the pair of alignment pins being spaced apart a distance matching a spacing distance between alignment holes on a surface of a lamp bank at a location for an edge pyrometer. Further, the jig can be configured such that a center axis of the slot is offset a predefined distance (e.g., in the range of 2 to 10 millimeters, with 4 to 6 millimeters useful in some cases) from a location between the pair of alignment pins associated with a transmission channel in the lamp bank configured to transmit a signal to the edge pyrometer.

The alignment jig may also include a clamp operable for fastening the fiber optic sensor to the body. Additionally, the jig may include a pair of holes in the body for receiving a pair of fasteners at spaced apart locations matching a spacing between a pair of threaded holes in the surface of the lamp bank provided for fastening a mounting stand for the edge pyrometer to the lamp bank.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

DETAILED DESCRIPTION

Figure 1:
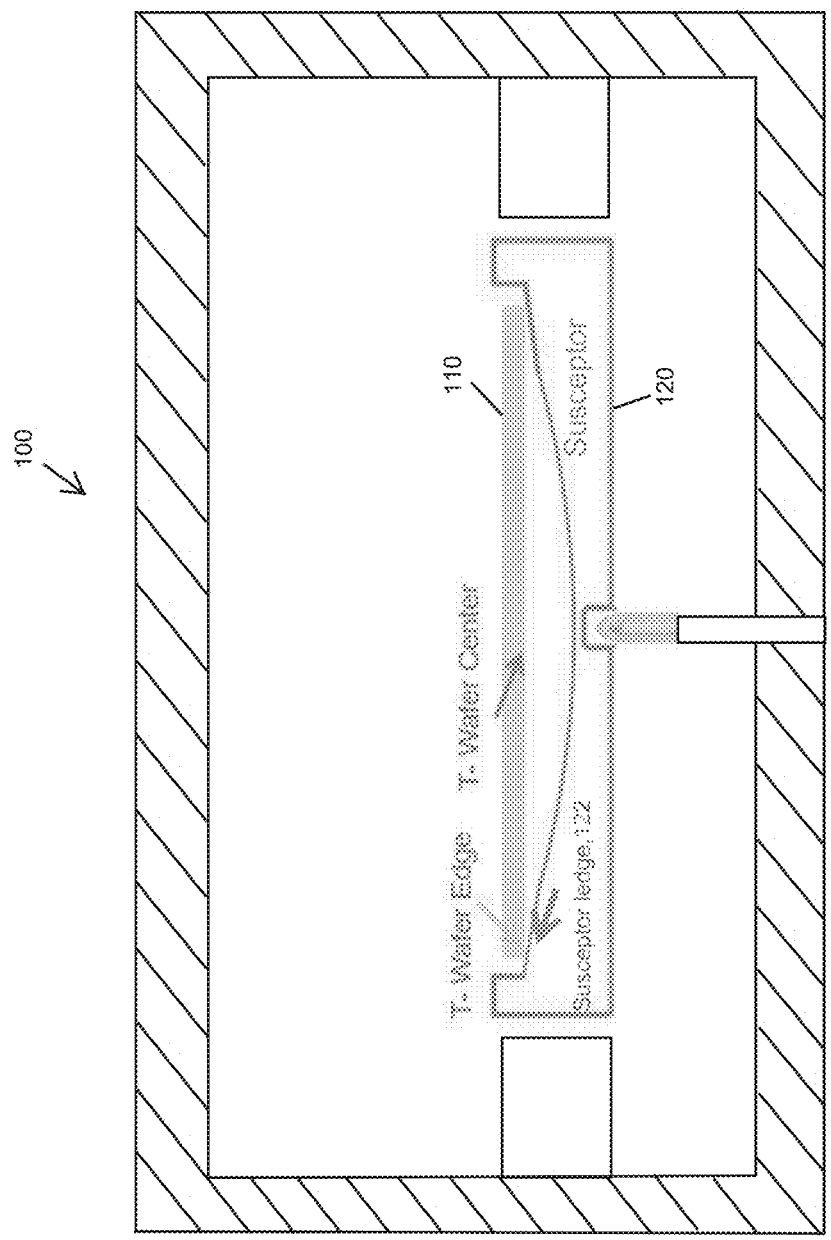
FIG. 1 is a simplified cross-sectional view of a portion of a reaction chamber with a conventional layout with a susceptor supporting a wafer during deposition processes.

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the terms "wafer" and "substrate" may be used interchangeably to refer to any underlying material or materials that may be used, or upon which, a device, a circuit, or a film may be formed.

As used herein, the term "chemical vapor deposition" (CVD) may refer to any process wherein a substrate is exposed to one or more volatile precursors, which react and/or decompose on a substrate surface to produce a desired deposition.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As described in greater detail below, various details and embodiments of the disclosure may be utilized in conjunction with a reaction chamber configured for a multitude of deposition processes, including but not limited to, ALD, CVD, metalorganic chemical vapor deposition (MOCVD), and MBE, physical vapor deposition (PVD). The embodiments of the disclosure may also be utilized in semiconductor processing systems configured for processing a substrate with a reactive precursor, which may also include etch processes, such as, for example, reactive ion etching (ME), capacitively coupled plasma etching (CCP), and electron cyclotron resonance etching (ECR).

The inventors recognized the importance of sensing and monitoring the temperature of the far edge of a wafer during deposition processes to form thin films, and the inventors created a reactor system that utilizes an edge pyrometer with a smaller field of view (fov) and that has a robust system design that supports an installation methodology to ensure proper alignment of the edge pyrometer to read temperatures at the edge of the wafer with each tool setup or system assembly process.

With regard to utilizing a smaller field of view, the edge (and center) pyrometer is provided in the reactor system so that electromagnetic radiation emitted from the surface wafer (or film developing on the surface of the wafer) is directed through (or the pyrometer is looking through) a reflector or lamp bank opening to measure the wafer temperature. Working distance for the pyrometer can be controlled by its height in the pyrometer mounting stand. The cylindrical opening or light outlet in the mounting stand can be defined to accommodate the field of view desired for the edge (and center) pyrometer, and the dimension of the opening hole or aperture in the reflector or lamp bank can be defined to serve as the signal clipping aperture to reject the energy outside the spot area or reduced target area on the wafer. The position of the opening hole or aperture in the reflector or lamp bank can be defined to ensure the wafer far edge is in the field of view of the edge pyrometer. By utilizing an edge pyrometer with a small sensing spot, the thermal gradient on the far edge of the wafer within the sensing area will be less than for the larger sensing spot center pyrometer. Hence, the temperature reading from the edge pyrometer will be closer to the actual local edge temperature on the wafer.

With regard to achieving proper edge pyrometer alignment to read wafer edge temperatures, the edge pyrometer, with its refined field of view, is positioned to receive electromagnetic radiation emitted by the surface of the wafer (or developing film thereon) from the wafer far edge (e.g., at a radius of 145 millimeter (mm) (or R145 mm) with a wafer with a radius of 150 mm (R150 mm) and a spot size of 5 to 7 mm or the like in outer diameter (OD)), and its output or sensed temperature being used for temperature control by the reactor system. To accurately place the edge pyrometer (e.g., at a R145 mm radial position), a methodology was developed that makes use of an alignment jig (or pyrometer jig) along with an edge sensor (e.g., a fiber optic sensor), which identifies the edge of the wafer (e.g., the R150 mm radial position).

The fiber sensor is held robustly in place using the jig and a lamp bank modified to receive the jig and to put the far edge pyrometer at a desired location (e.g., with its received stream or energy centered at R145 mm or the like). The lamp bank may have a slot drilled on the counterbore to receive the fiber sensor in a radial offset from the desired edge pyrometer position (e.g., 5 to 7 mm offset from the R145 mm radial position or at about a radial position of R150 mm in the present example of a R150 mm wafer or substrate). The jig used the alignment holes on the lamp bank created for the edge pyrometer, which makes the system design ergonomic. When the wafer edge (e.g., at R150 mm) is seen or sensed by the fiber sensor through the lamp bank, the alignment method provides a guarantee that, with the lamp bank in this mounting position, the edge pyrometer will be placed at a desired location (e.g., R145 mm) accurately.

Figure 2:
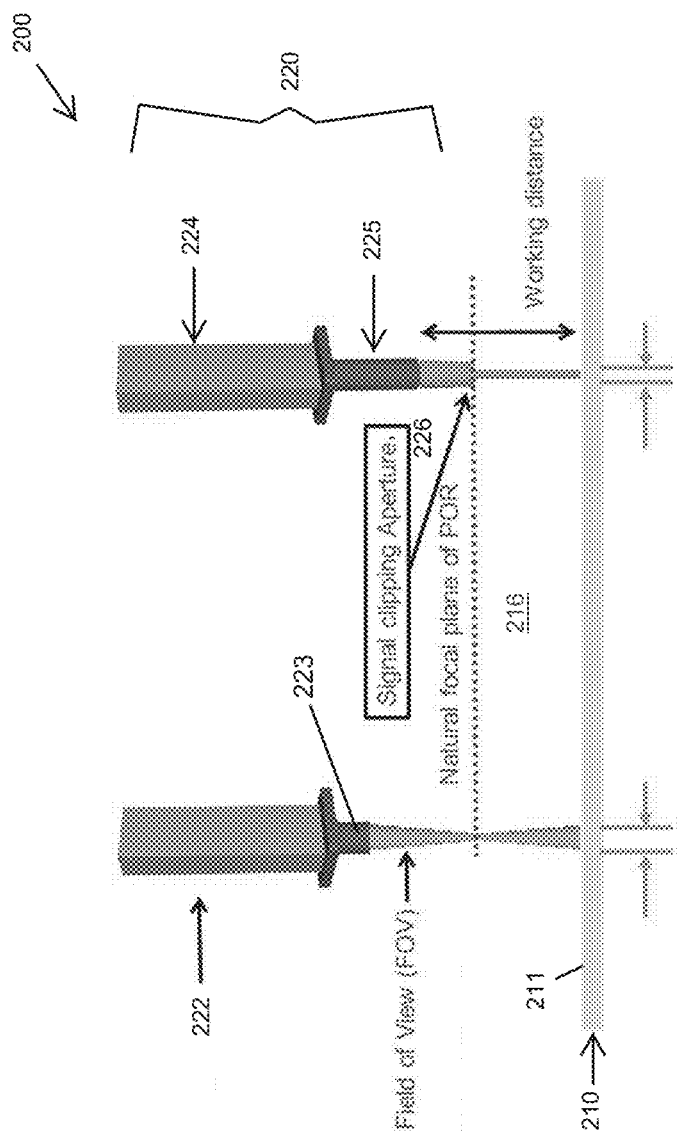
FIG. 2 illustrates a partial side view of a reactor system of the present description showing a temperature monitoring assembly with a center pyrometer and an edge pyrometer illustrating working principles of a small spot IR pyrometer.

FIG. 2 illustrates a partial view of a reactor system of the present description that is useful for explaining working principles of a small spot IR pyrometer (i.e., the edge pyrometer 224 of system 200). The system 200 is shown to include a disk-shaped or circular wafer 210 that would be supported in the reactor system 200 using a susceptor (not shown but understood from FIG. 1), and the wafer or substrate 210 has an upper surface 211 (or surface upon which deposition will occur) exposed in the reaction chamber 216.

The reactor system 200 includes a temperature monitoring assembly 220 for monitoring a center portion of the wafer surface 211 and a far edge portion of the wafer 210. To this end, the assembly 220 includes a center pyrometer 222 receiving electromagnetic radiation (e.g., electromagnetic radiation from within an infrared waveband) emitted from a spot with a center coinciding with the center/central axis of the wafer 210 (or positioned so the center spot overlap a central portion of the wafer surface 211) and further includes an edge pyrometer 224 receiving electromagnetic radiation emitted from a spot with a center at or near the edge of the wafer 210 (e.g., with a center a small distance from the edge such as at a radial position of R145 mm for a wafer with an edge at R150 mm and with a spot diameter of 5 to 7 mm).

The center pyrometer 222 has a lens tube 223 with a length chosen such that the received electromagnetic radiation is received from a field of view that provides it with a natural focal size and a natural focal plane, and which provides a relatively large spot size on the wafer surface 211, e.g., in the range of 15 to 20 mm in diameter. In contrast, the assembly 220 is configured in some useful embodiments such that the field of view of the edge pyrometer is adjusted using a longer lens or lens tube 225 (than that of the center pyrometer 222 (e.g., one that is 75 to 150 percent longer or the like) and such that outlet of the view channel through the upper wall of the reaction chamber 216 acts as a signal clipping aperture 226. In this manner, sensing area is reduced by providing a spot size at the edge of the wafer 210 of 5 to 7 mm (spot diameter) compared with a spot size from the center pyrometer 222 of 15 to 20 mm (spot diameter).

Figure 3:
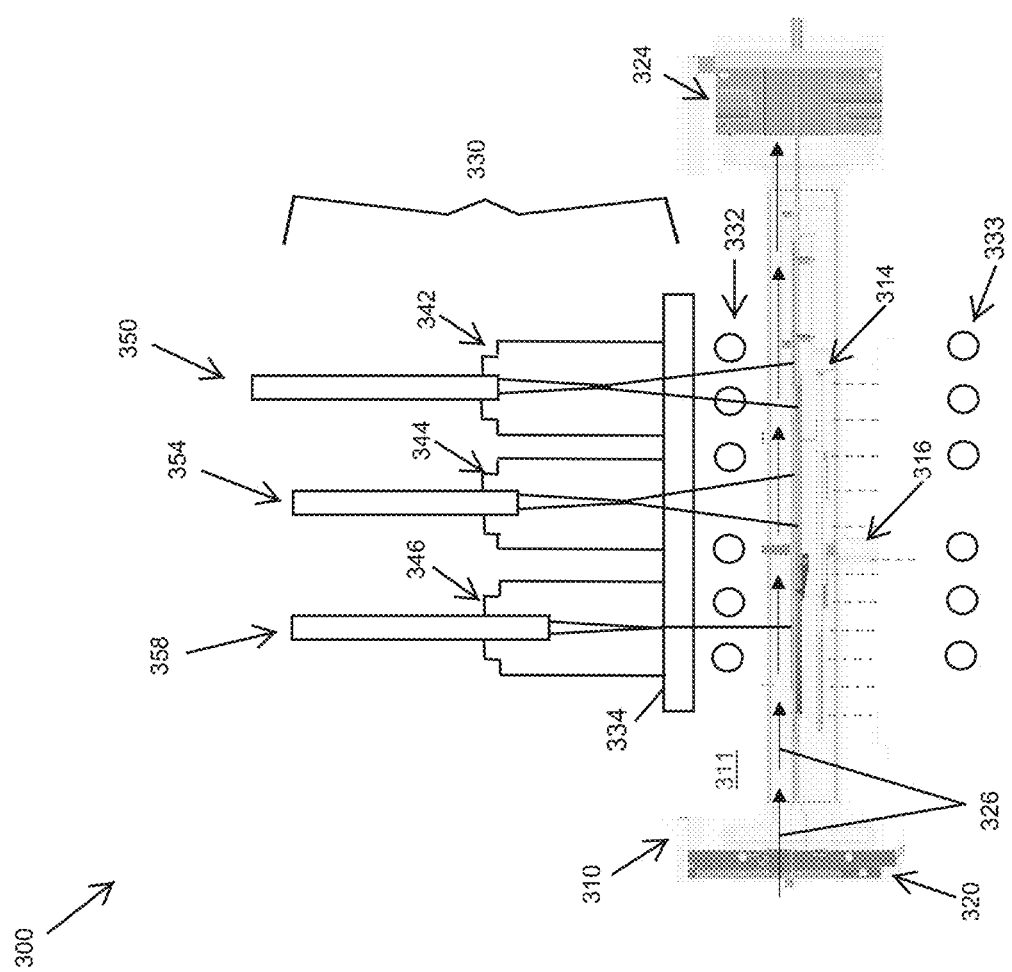
FIG. 3 illustrates a schematic sectional view of a portion of reactor system with a reaction chamber equipped with a temperature monitoring assembly of the present description.

FIG. 3 illustrates a reactor system 300 in which a temperature monitoring assembly 330 of the present description has been provided on or in a reaction chamber 310 to accurately measure both center temperatures and far edge temperatures of the wafer undergoing a deposition process. The reaction chamber may take the form of an epitaxial growth (EPI) chamber, with an upper domain and a lower domain, and the temperature monitoring assembly 330 may include three temperature measurement devices (e.g., pyrometers or the like) as shown with quartz pyrometer 350, center pyrometer 354, and edge pyrometer 358 or more may be utilized in addition to these.

As shown, a susceptor 314 is positioned within an inner chamber 311 of the epitaxial growth chamber 310 and connected to a rotation shaft 316. Prior to epitaxial growth, a wafer (not shown) would be placed on the susceptor 314, and, then, a layer of epitaxial film or will be grown on top of the wafer. A gas supply source (not shown) would be connected to the chamber 310 via an injection flange 320. An exhaust flange 324 is positioned in the system 300 opposite the injection flange 320. The mixed precursors, as shown with arrows 326, would be caused to flow from the injection flange 320 into the inner chamber 311 and then exit from the exhaust flange 324 during deposition with system 300. The epitaxial growth chamber 310 further includes a variety of heating sources, which may be implemented using lamp banks as shown including upper lamp bank 332 over which a reflector 334 is provided that faces the susceptor 314 (and an exposed surface of a wafer received on the susceptor 314) and lower lamp bank 333 provided on a lower side of the susceptor 314.

As shown, the system 300 includes a temperature monitoring assembly 330 that may be considered to include or be attached to the lamp bank 332, which may be modified as discussed herein to facilitate alignment of the edge pyrometer 358 with the susceptor 314 (or a far edge of a wafer placed thereon) and reflector 334. During operations, as shown, electromagnetic radiation is emitted from the upper surface of the wafer (or the developing epitaxial film on the upper surface of the wafer), passes from the inner chamber 311 through the upper wall of the chamber and opening or viewing channels in the lamp bank 332, and thereafter through reflector 334 and received at the pyrometers 350, 354, and 358. The assembly 330 includes three or more pyrometers that operate to provide temperature measurements during operation of the system 300 and that are mounted onto the lamp bank 332 with a mounting assembly 340. As shown, one (or more) pyrometer 350 is mounted with mounting stand 342 to the lamp bank 332 on a side opposite the susceptor 314, and the quartz pyrometer 350 is used to measure reaction chamber temperature and to provide feedback to a controller of the system 300 (not shown) for proper cooling control.

Significantly, two (or more) pyrometers are included in the assembly 330 to measure wafer temperatures at two or more different locations and are mounted to the lamp bank 332 (again, on a side opposite the susceptor 314) in orientations to receive electromagnetic radiation emitted by the upper surface of the wafer (or depositing film thereon) from a wafer positioned on the susceptor 314. A center pyrometer 354 is mounted to the lamp bank 332 so as to receive electromagnetic radiation emitted by the upper surface of the wafer (or depositing film thereon) from a center portion of a wafer (or developing film thereon) seated on the susceptor 314 (e.g., with a spot having a center point coinciding with a center axis of the rotatable shaft 316 and a wafer or at least overlapping a center of the wafer). As shown, an edge pyrometer 358 is mounted to the lamp bank with mounting stand 346, which is configured to provide a refined field of view (compared with center pyrometer 354), so as to be focusing at the far edge of a wafer received on the susceptor 314. Its output or sensed edge temperature is used as feedback to achieve improved temperature control within the chamber 310 (e.g., more uniform temperature distribution across a wafer on susceptor 314). In the schematic of system 300 of FIG. 3, the edge pyrometer 358 is located at a front (i.e., upstream relative to the general direction of film precursor across the wafer) of the chamber, but its position may be varied to implement the system 300 and is not limited to the shown front position.

Figure 4:
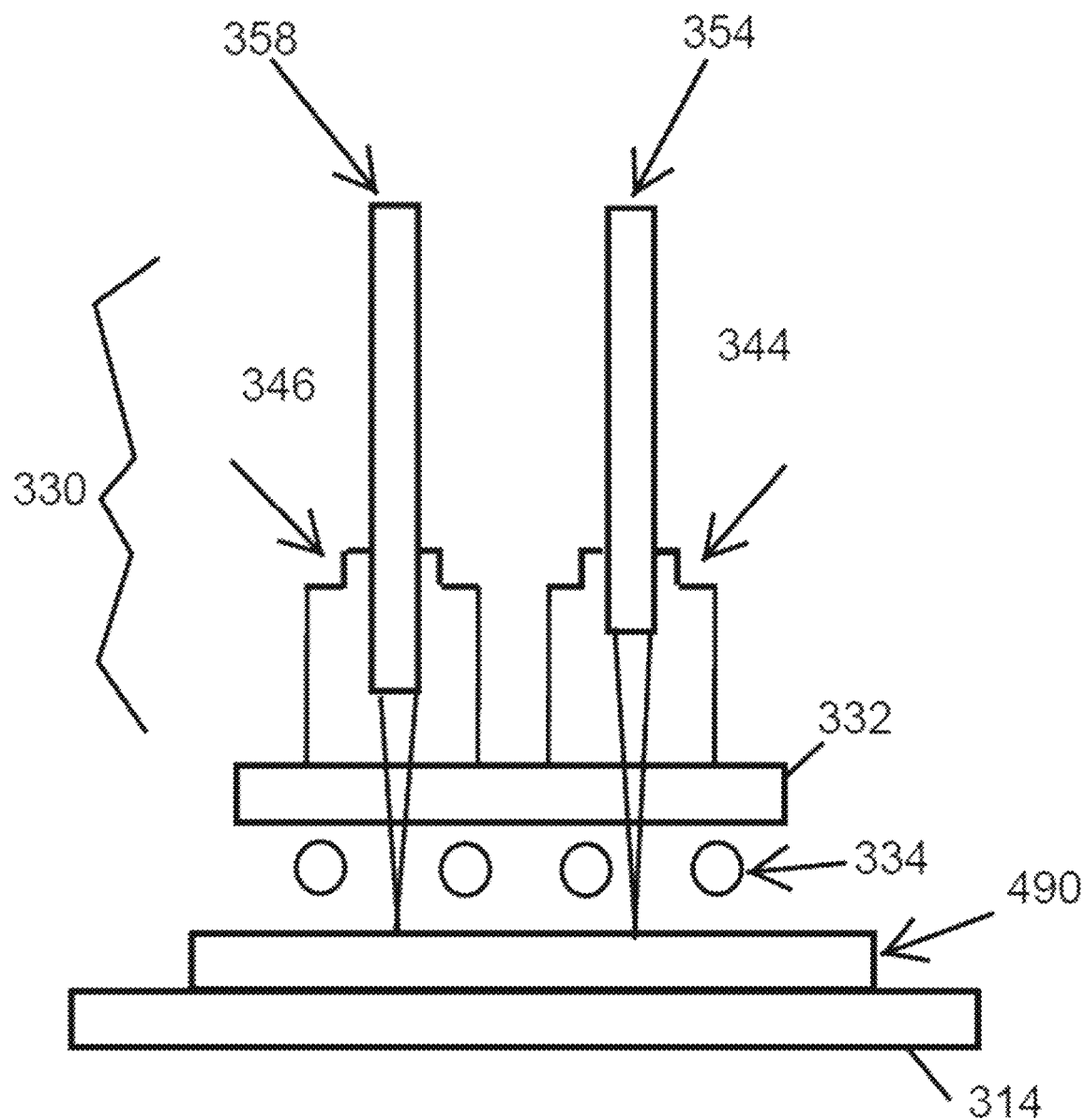
FIG. 4 illustrates an enlarged view of a portion of the temperature monitoring assembly showing further details of the mounting stands for the edge and center pyrometers.

FIG. 4 illustrates an enlarged view of a portion of the temperature monitoring assembly 330 showing further details of the mounting stands 344 and 346 for the edge and center pyrometers 358 and 354, respectively. With the pyrometers 354, 358 inserted into the mounting stands 344, 346 and the stands 344, 346 affixed to the upper or outer surface of the lamp bank 332 (e.g., on a surface of the reflector opposite the chamber), the pyrometers 354, 358 are looking through (or receiving electromagnetic radiation therethrough) openings in the reflector 334 to measure center and edge temperatures of a wafer 490 positioned on the susceptor 314.

Figure 5:
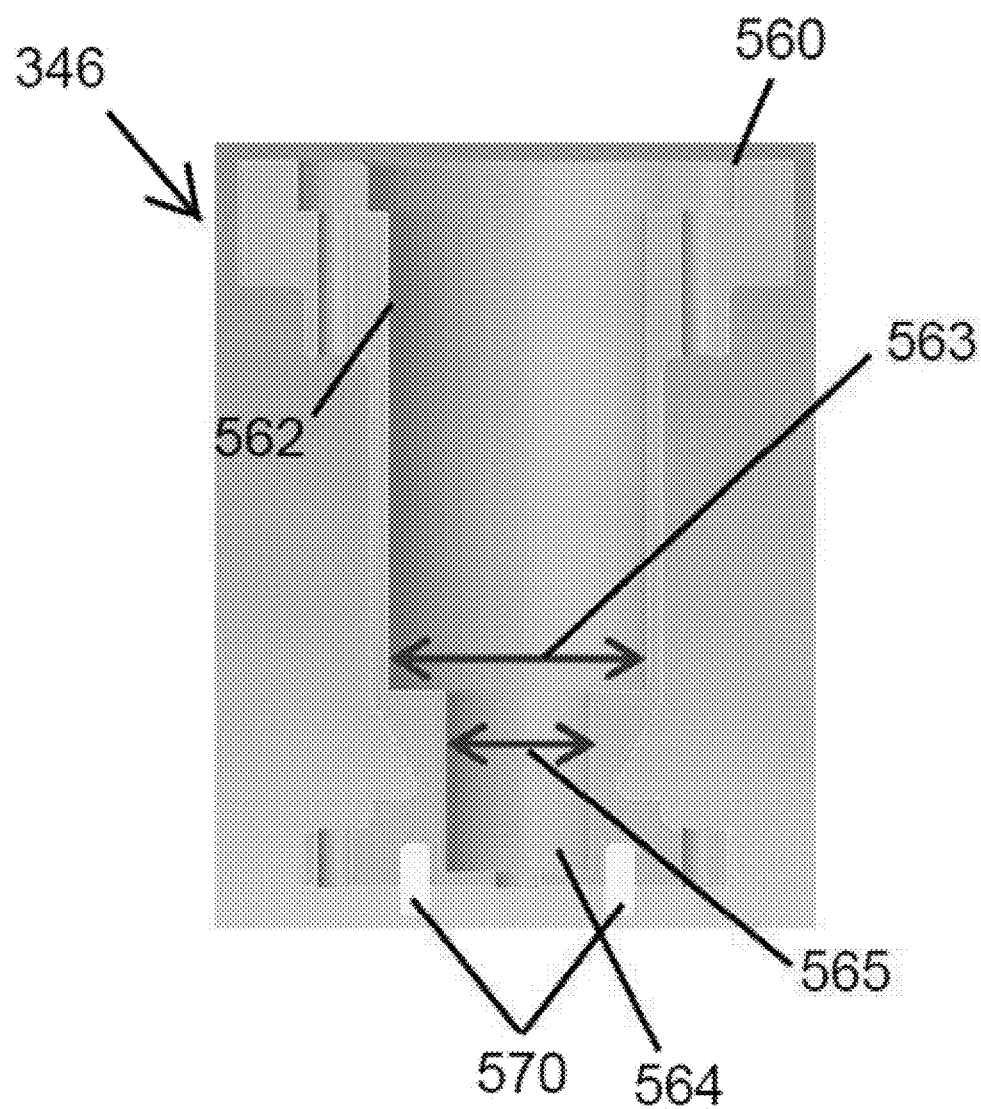
FIG. 5 illustrates a side sectional view of the edge pyrometer stand of FIGS. 3 and 4.

The working distance for each pyrometer 354, 358 is controlled in part by the height of its mounting stand 344, 346. FIG. 5 illustrates, for example, the mounting stand 346 for the edge pyrometer 358 (prior to insertion of the pyrometer 358 for ease of explanation). As shown, the stand 346 includes a body 560 with a lens receptacle or channel defined by a first inner wall 562, which is shaped and sized to receive the lens tube of the pyrometer 358 including with an opening diameter, shown with arrows 563, that is at least as large as an outer diameter of the lens tube. Pins 570 at the base of stand 560 are provided to accurately mate the stand 560 with alignment holes provided on the upper or outer surface of the lamp bank 332 to align emitted by the upper surface of the wafer (or depositing film thereon) received at the of the pyrometers through openings or holes/transmission channels through the lamp bank 332 and the reflector 334.

Proximate to the stand outlet, the body 560 includes a second inner wall 564 with an outlet diameter, shown with arrows 565, less than the opening diameter such that the end of the lens tube of the pyrometer will mate with the ledge or shoulder between these two inner walls 562 and 564. The cylindrical opening and stand outlet defined by the second inner wall 564 of the stand body is selected so as to accommodate or set the field of view for that particular pyrometer (as discussed with reference to FIG. 2). Further, the dimensions (i.e., outer diameter) of the opening holes or transmission channels in the reflector 334 are chosen so that the reflector opening holes or transmission channels serve as the signal clipping aperture of the edge pyrometer 358 to reject the energy or light outside the target reduced wafer area (or spot).

Figure 6:
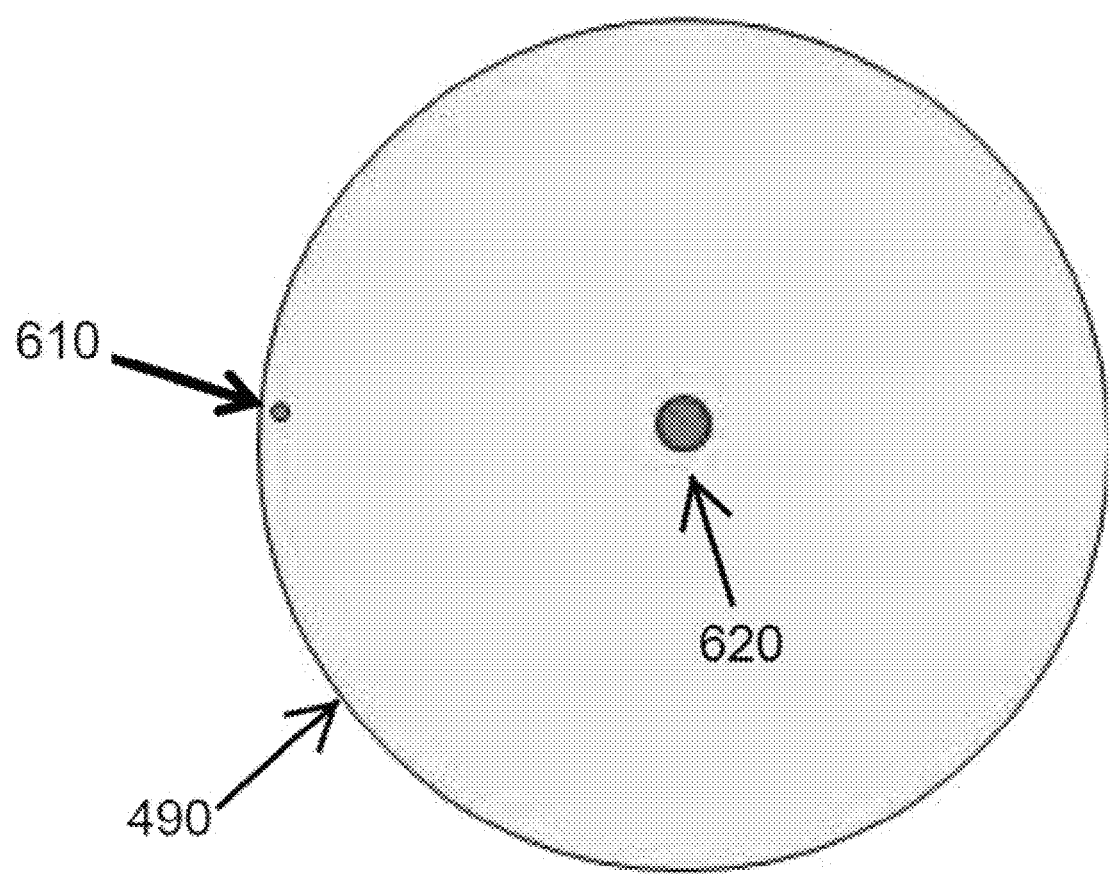
FIG. 6 is a top view of a wafer during temperature monitoring illustrating center and far edge temperature monitoring with the temperature monitoring assembly of FIGS. 3 and 4.

The position of the opening hole in the reflector 334 is chosen or defined in the design to ensure the wafer far edge is in the field of view of the edge pyrometer. FIG. 6 illustrates schematically the wafer 490 during operations of the pyrometers 354 and 358 to measure center wafer temperatures with a larger spot 620 (larger spot area set by larger outer diameter of energy or light from center pyrometer 354) and to concurrently measure edge (at or within a distance of about 1 to 5 mm from the edge of wafer 490) temperatures of the wafer 490 with a smaller spot 610 (small spot or sensing area set by smaller outer diameter of energy or light from edge pyrometer 358 at surface of the wafer 490 as shown). By utilizing an edge pyrometer 358 configured (via design of components of the temperature monitoring assembly 330) to produce and use a small sensing spot 610, the thermal gradient on the far edge of the wafer 490 with the sensing area/spot 610 will be less during typical deposition processes. Hence, the temperature reading from the edge pyrometer 358, which is fed to a controller for use in temperature monitoring and control for a reactor system, will be closer to the actual local temperature on the wafer 490.

Figure 7:
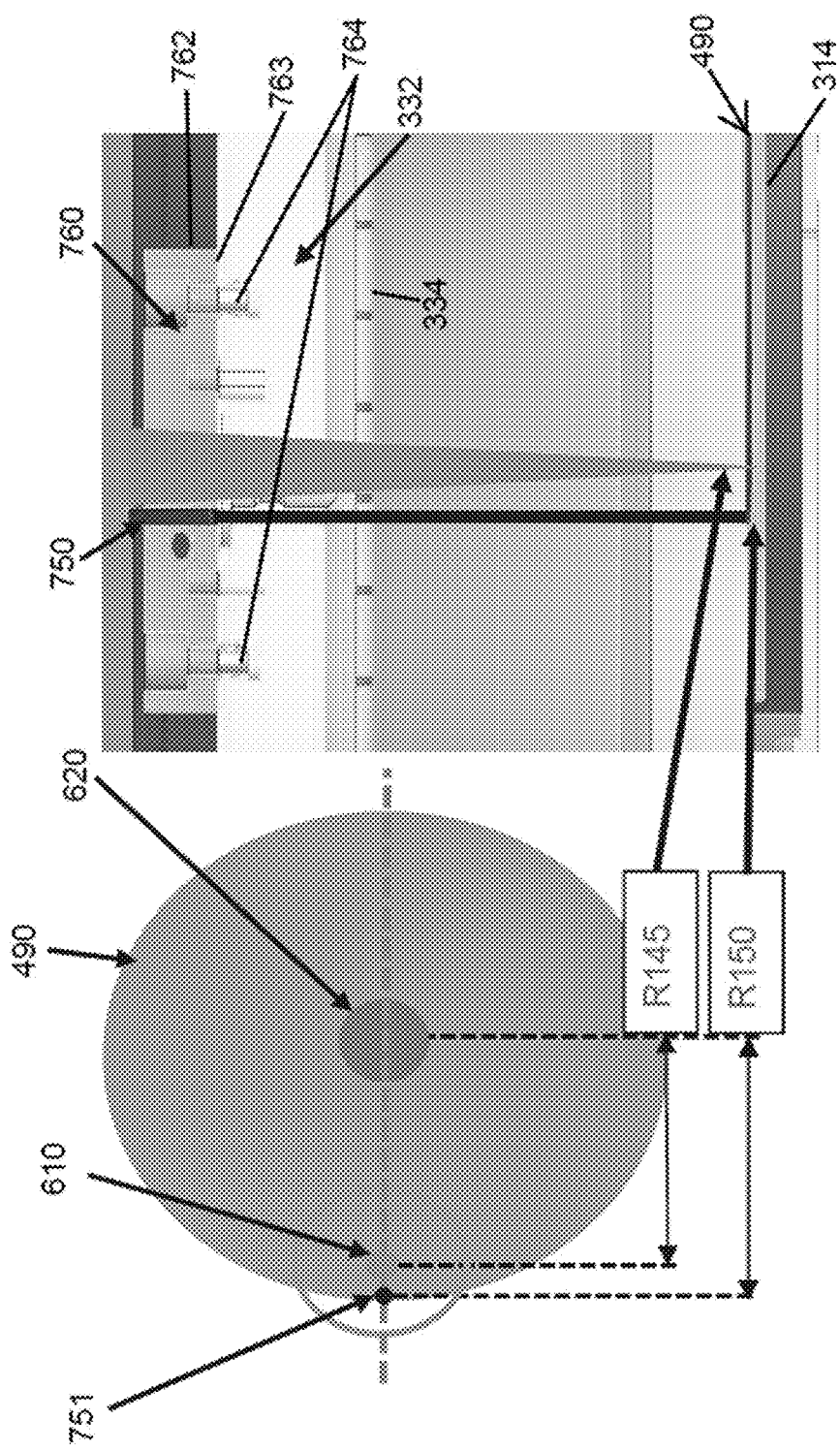
FIG. 7 illustrates a portion of the reactor system of FIG. 3 during alignment operations to ensure proper monitoring of edge and center wafer temperatures, along with a top view of the wafer installed in the reactor system for alignment purposes.
Figure 9:
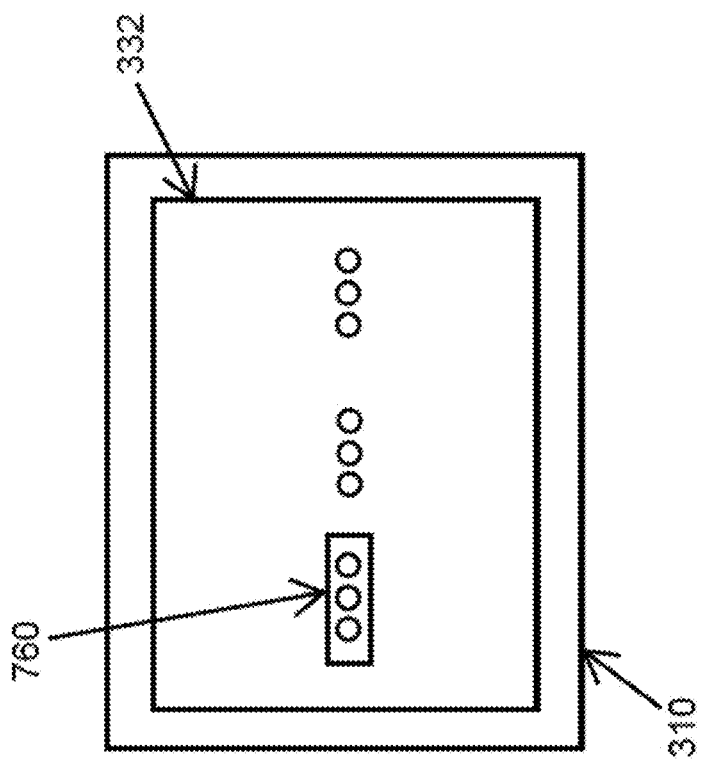
FIG. 9 is a top view of the lamp bank of FIG. 7 showing an installed pyrometer alignment jig.
Figure 8:
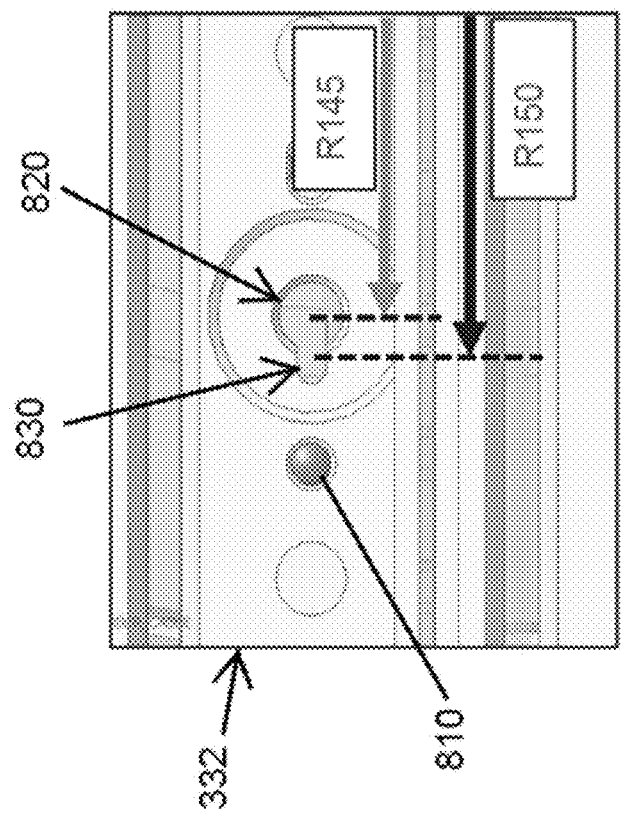
FIG. 8 illustrates an enlarged view of the outer or top surface of a lamp bank of the present description illustrating the alignment holes for pyrometer placement and opening holes/transmission channels between the pair of alignment holes for passing energy or light from the edge sensor and a later received edgy pyrometer.
Figure 10:
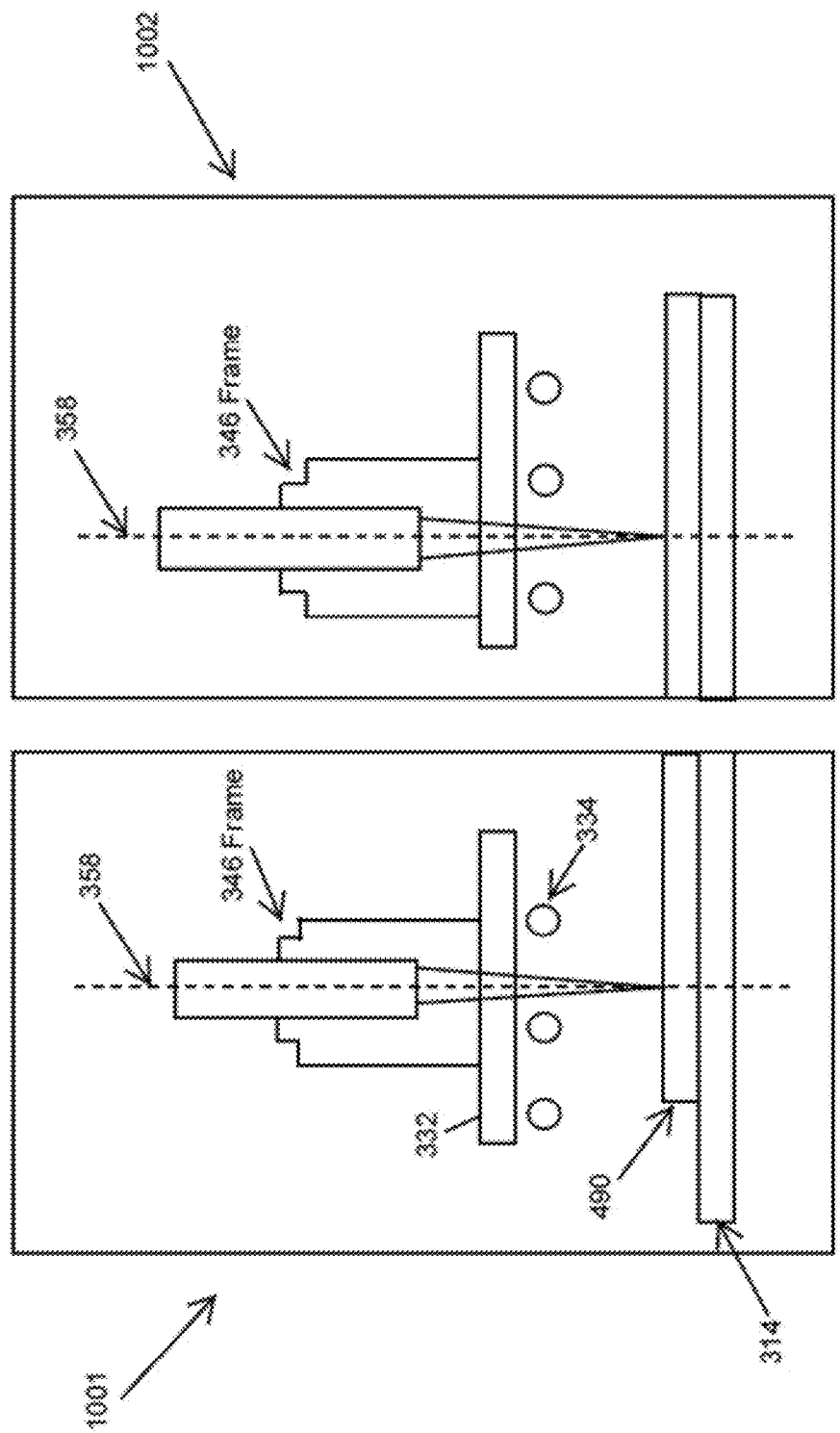
FIG. 10 is a side sectional view showing two views of a reactor system without proper pyrometer alignment and after alignment operations with the methods described herein.
Figure 11:
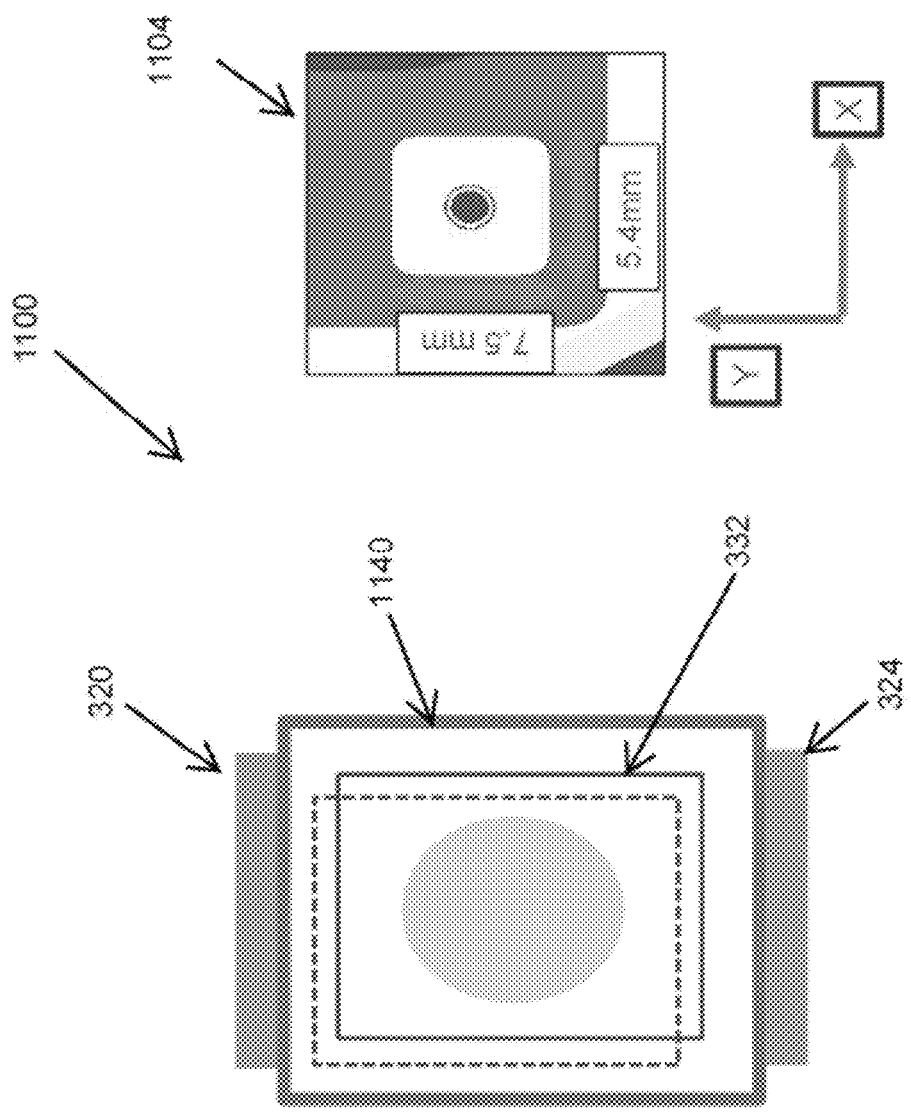
FIGS. 11-18 illustrate schematically installation of a lamp bank, in the reactor system of FIGS. 3-10, to achieve alignment of a temperature monitoring assembly to provide proper edge temperature monitoring.

With the usefulness of an edge pyrometer understood, it may now be useful to explain in detail edgy pyrometer installation to ensure proper alignment with a monitored wafer on the susceptor and design of the alignment or installation jig used to ensure proper alignment. FIG. 7 illustrates a portion of the reactor system of FIG. 3 during alignment operations to ensure proper monitoring edge and center wafer temperatures with an edge pyrometer, along with a top view of the wafer 490 positioned in the reactor system. FIG. 8 illustrates an enlarged view of the outer or top surface of a lamp bank 332 of the present description illustrating the alignment holes 810 for pyrometer placement and opening holes/transmission channels 820 and 830 between the pair of alignment holes for passing energy or light from a later received edgy pyrometer and from the edge sensor (e.g., fiber sensor). FIG. 9 is a top view of the lamp bank of FIG. 7 showing an installed pyrometer alignment jig 760. FIG. 10 is a side sectional view showing two views 1001 and 1002 of a reactor system without proper pyrometer alignment and after alignment operations with the methods described herein.

It is desirable that the edge pyrometer with a refined field of view, when installed, will be focusing at the wafer far edge or a radial location near to this edge, e.g., with the center of its focus spot or sensing area 610 at R145 mm for an R150 mm wafer 490 (as shown in FIG. 7). Its output or sensed temperatures will be used by a reactor system controller for temperature control at the edge of the wafer 490. To accurately place the edge pyrometer at this radial position (e.g., R145 mm), a methodology and associated hardware was designed by the inventors, and the hardware includes a fiber sensor 750 that is positioned relative to the lamp bank 332 of a reaction chamber 310 using an installation or alignment jig 760 (as shown in FIG. 7 and FIG. 9).

The fiber sensor is held robustly in place using the jig 760. The combination of the design of the jig 760 and the modified lamp bank 332 function to place the far edge pyrometer at a desired location (e.g., with the pyrometer's sensor area or spot being at R145 mm for example) when it is installed upon the lamp bank, which is mounted in an aligned position in the reactor 310 per the alignment method described below. Particularly, as shown in FIG. 8, the lamp bank 332 is designed to include a hole or transmission channel 820 through which energy or light from the edge pyrometer will pass, and pins 570 from the mounting stand 346 are positioned within alignment holes 810 during assembly of the mounting assembly 340 and pyrometers onto the lamp bank 332 (after alignment of the lamp bank 332 is completed).

The lamp bank 332 further includes a slot 830 that extends through the lamp bank 332 adjacent the transmission channel 820, which may be created by drilling on the counterbore. The location of the slot 830 relative to the transmission hole 820 is selected so a fiber sensor 750 positioned in the slot 830 can read an edge of the wafer 490 (which is placed on the susceptor of the reaction chamber 310). For example, it may be placed at the radial offset selected for the edge pyrometer spot 610 relative to the edge of the wafer 490, e.g., an offset in the range of 2 to 10 mm in some cases with 5 mm offset being used for an edge pyrometer positioned at R145 mm for monitoring an R150 mm wafer 490. The offset distance is measured from a center of the outermost alignment hole 820 to a center of the circular slot 830 and with the two centers being in a falling on a line extending from a center of a received wafer 490 to its edge (or from a center of the rotating shaft of the susceptor to a circumferential point on the susceptor).

The jig 760 is configured with pins 761 on a lower surface 763 of its body 762, and these pins 761 are positioned and sized to mate with the alignment holes 810 on the lamp bank 332 when the jig's surface 763 is mated with the upper or outer surface of the lamp bank 332. This helps make the alignment system ergonomic. During use in alignment processes, the edge of the wafer 490 (which may be at R150 mm in some embodiments) as shown in FIG. 7, and, with the lamp bank 332 attached to the reactor 310 in this position, there is an assurance that an edge pyrometer placed on the lamp bank 332 (e.g., with its mounting stand taking the place of the jig 760) will be located at the desired location (e.g., with its sensor area/spot centered at R145 mm or another desired radial position).

With further reference to FIG. 10, it will be understood that the inventors were tasked with developing a robust method (and associated hardware) to ensure the edge pyrometer 358 in mounting stand 346 is seeing the far edge of the wafer 490 precisely and not the susceptor 314. To this end, the alignment assembly or hardware includes an edge sensor 750, which may take the form of a fiber optical sensor with a narrow beam size (e.g., 0.2 mm), to identify the interface between the wafer 490 and the susceptor 314. This edge or interface identification is achieved by processing the output of the sensor 750 to identify differences in reflectivity as the wafer 490 typically will have high reflectivity while the susceptor 314 will have low reflectivity, and the edge/interface can be identified by identifying the large change in reflectivity using the edge sensory 750. View 1001 shows an improperly positioned or an unaligned edge pyrometer 358 with the edge of the wafer 490 while view 1002 shows a properly positioned or aligned edge pyrometer 358, such as would be achieved using the alignment hardware and methods described herein.

FIGS. 11-18 illustrate schematically installation of a lamp bank, in the reactor system 300 of FIGS. 3-10, to achieve alignment of a temperature monitoring assembly to provide proper edge temperature monitoring. The installation or alignment method shown in FIGS. 11-18 utilizes the alignment jig 760, the modified lamp bank 332, and a fiber optic sensor 750 to achieve desired alignment of the edge pyrometer 358. The methodology or process begins with the step 1100 shown in FIG. 11 with installing the lamp bank 332 on the tool/reactor. Specifically, the lamp bank (or upper lamp bank) 332 is positioned on the tool or reaction chamber lid 1140 to extend over the chamber horizontally between the injector flange 320 and the exhaust flange 324. As shown with graph 1104, the lamp bank 332 can have its position relative to inner surfaces/edges of the lid 1140 moved in both X and Y directions (e.g., as shown, with 5.4 mm movement in the X direction and with 7.5 mm movement in the Y direction).

Figure 12:
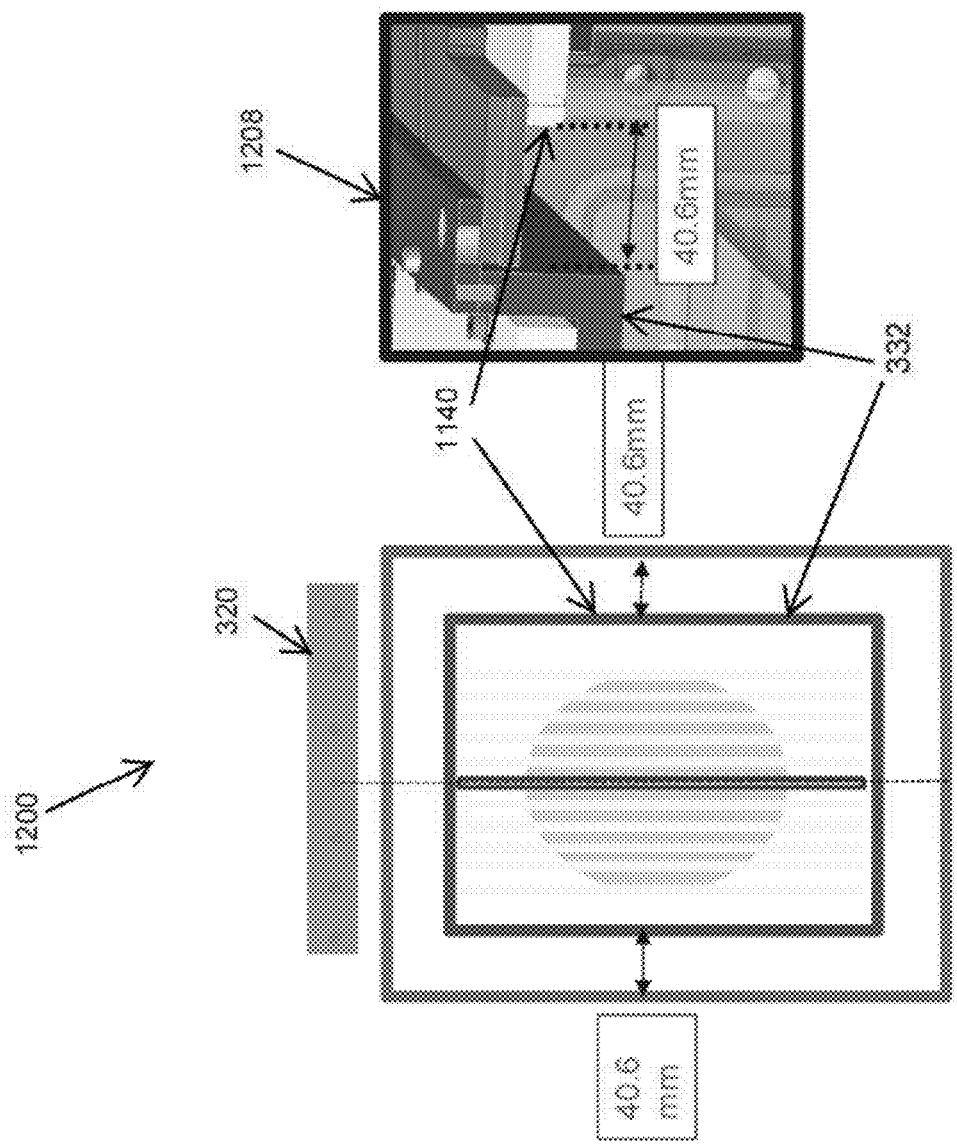
Figure 13:
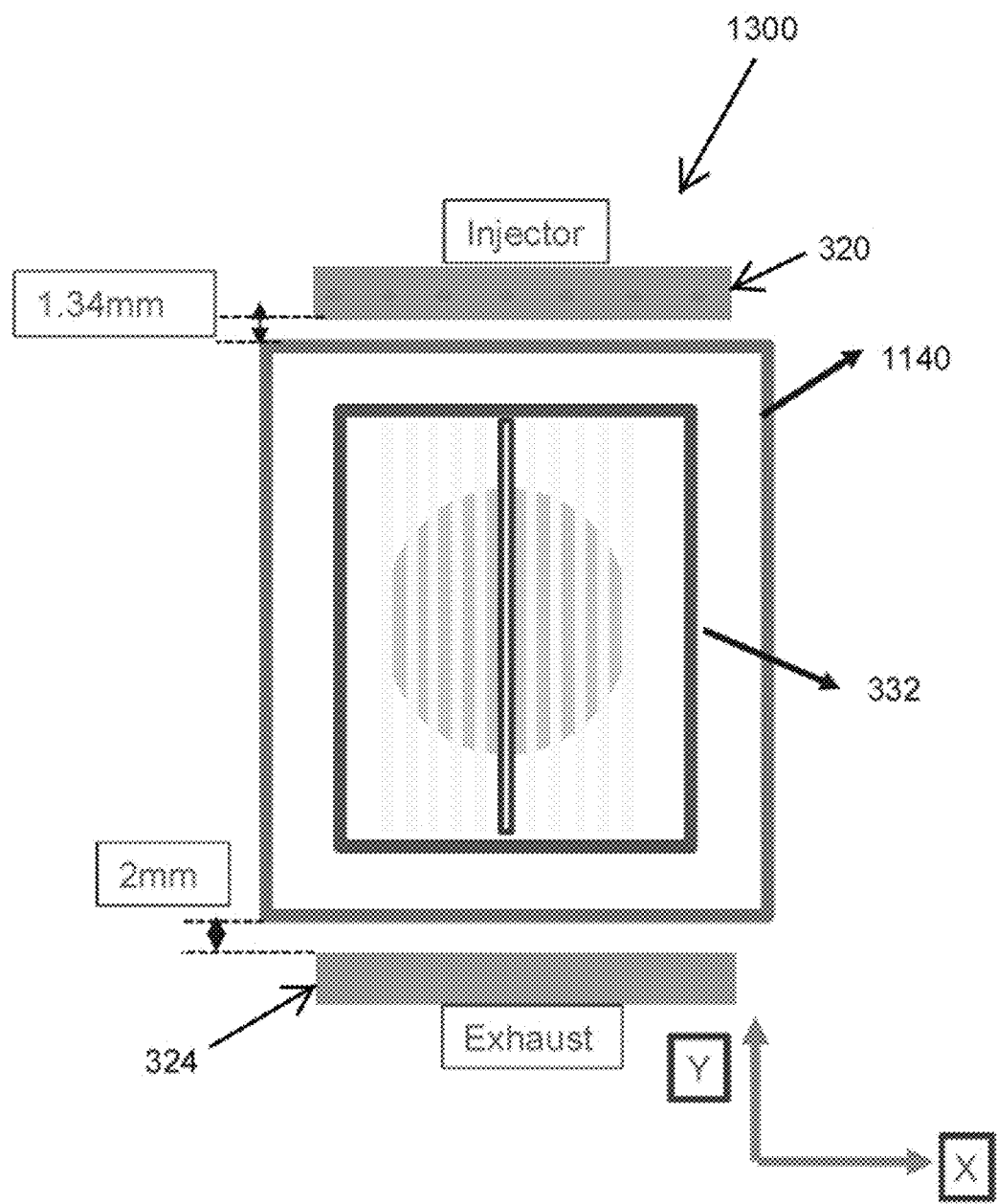

The method continues as shown in FIG. 12 with step 1200 that involves the placement of the lamp bank 332 relative to the lid 1140 in the "X" direction. This may involve, as shown in enlarged view 1208, confirming that the lamp bank 332 is equidistantly placed from the lid (or its inner edges) 1140 at a predefined distance (e.g., as shown at 40.6 mm). This X directional location of the lamp bank ensures that the center lamp of the bank 332 is aligned with a center injection port in some embodiments. Next, as shown in FIG. 13, the method continues with step 1300 involving placement of the lid 1140 in the "Y" direction with respect to the injector and exhaust flanges 320, such as at two predefined distances to provide proper lid placement on the tool/reaction chamber. In one useful, but non-limiting example, the lid 1140 is set at a distance of 2 mm from the exhaust flange 324 and at a distance of 1.34 mm from the injector flange 320.

Figure 14:
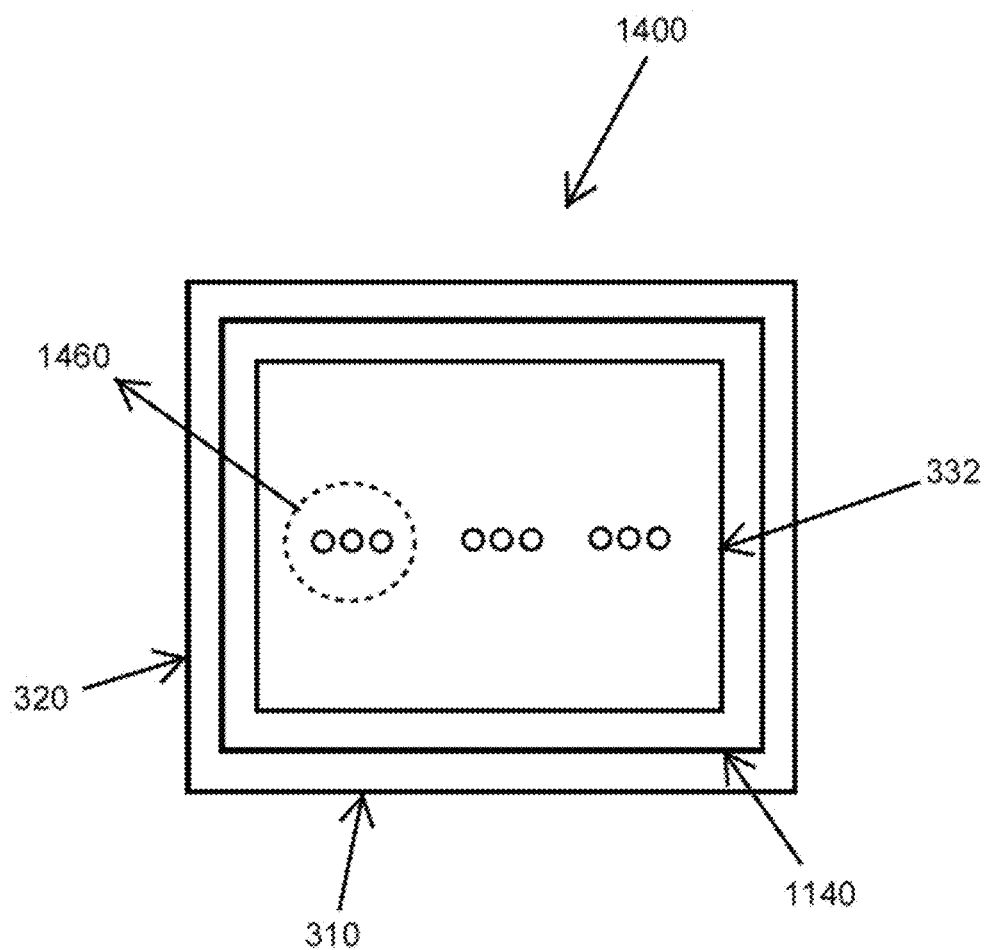
Figure 15:
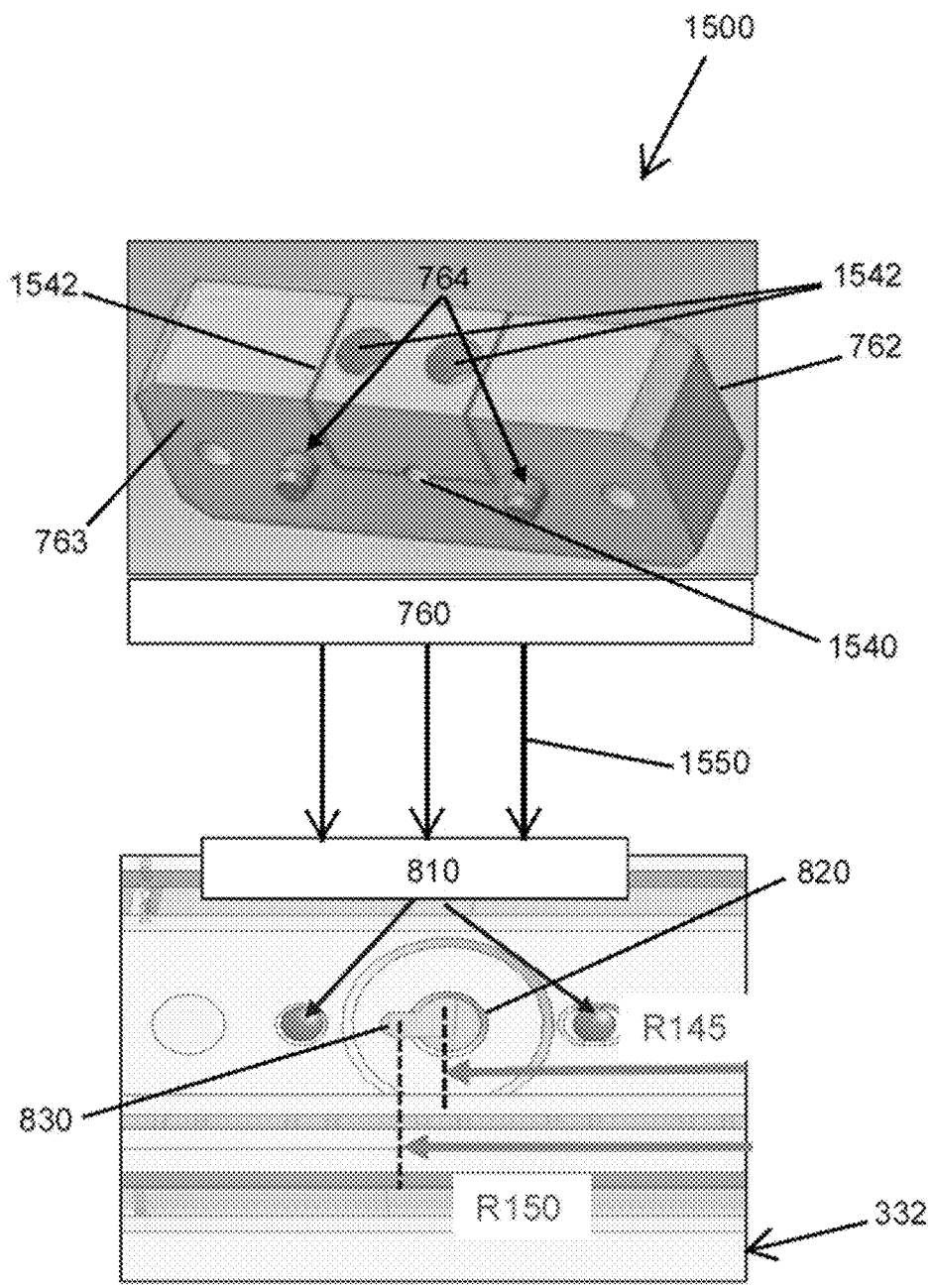

With the lid 1140 supporting the lamp bank 332 and the lid 1140 positioned in a desired or predefined X-Y location on the tool/reaction chamber, the method continues as shown in FIG. 14 with step 1400. This step includes placing the alignment or installation jig on the on the lamp bank 332 at or near the edge pyro jig placement location 1460. More specifically, as shown in substep 1500 of FIG. 15, the jig 760 (which may be thought of as an alignment jig or fiber sensor mounting jig) is robustly aligned on the lamp bank 332 using the alignment pins 764 provided on a bottom surface 763 of the jig body 762. The jig body 762 includes a slot or passageway 1540 for receiving a fiber optic sensor (e.g., for receiving radiation from the substrate (or developing film) on the susceptor at about R150 mm) and a slidable block 1542 for retaining the sensor in the slot 1540 when fasteners (not shown) are inserted into holes 1544 to move the block 1542 into abutting contact with other portions of the body 762. As shown with arrows 1550, step 1500 includes moving the jig 760 into abutting contact with the upper or outer surface of the lamp bank 332 with the pins 764 received into alignment holes 810 (i.e., edge pyrometer alignment holes) in the lamp bank 332, which allows the edge pyrometer to receive radiation from the substrate surface (or a developing film thereon) at about R145 mm.

Figure 16:
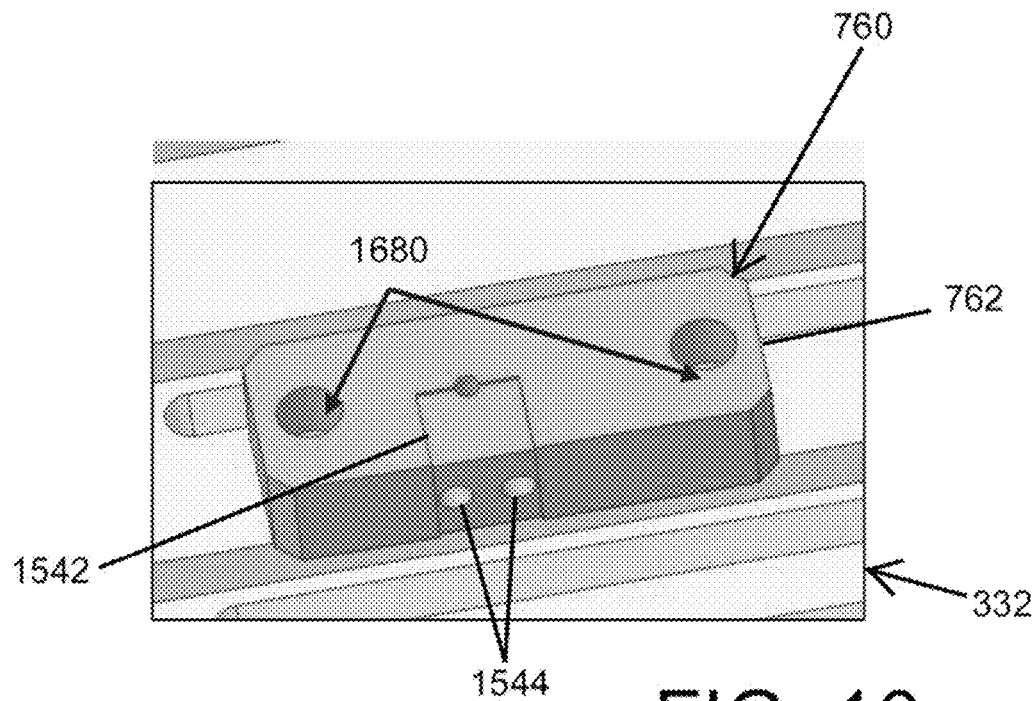
Figure 17:
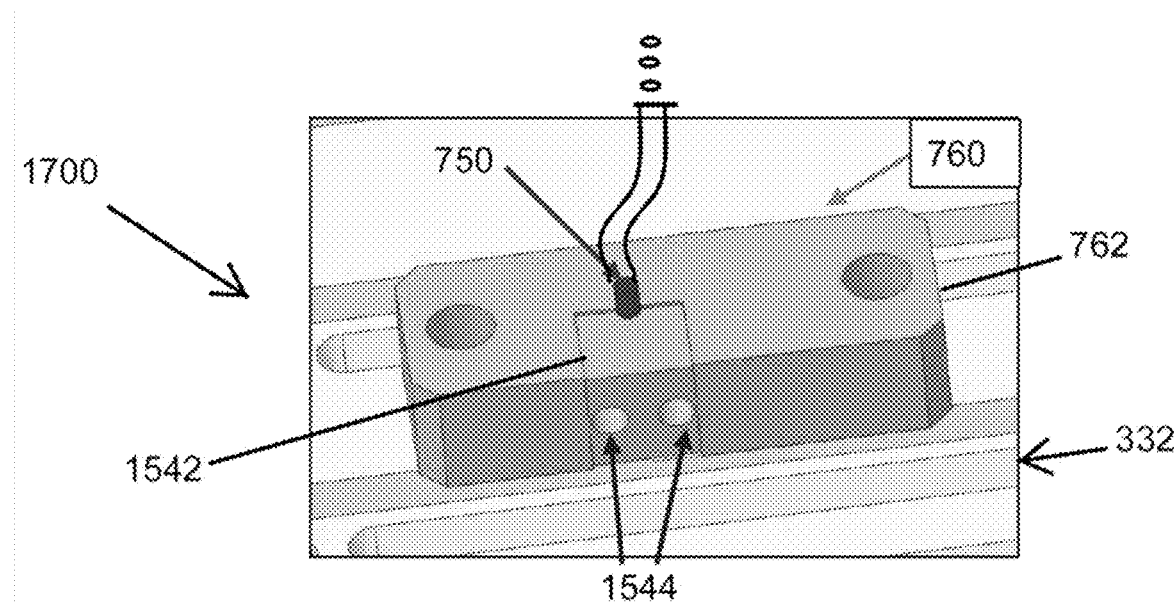

The method continues as shown in FIG. 16 with step 1600 in which screws or other fasteners (not shown) are inserted into holes 1680 in the jig body 762 and tightened so as to rigidly secure or rigidly mount the jig 760 on the lamp bank 332. Next, as shown in FIG. 17, step 1700 is performed including placing the fiber sensor 750 in the jig 760 (in passageway 1540) and then clamping the fiber sensor 750 in the jig 760 using clamping screws or other fasteners in the holes 1544 of the jig body 762. In this manner, the fiber 750 is retained so that it is perpendicular to the lamp bank's upper or outer surface upon which the jig 760 is mounted.

Figure 18:
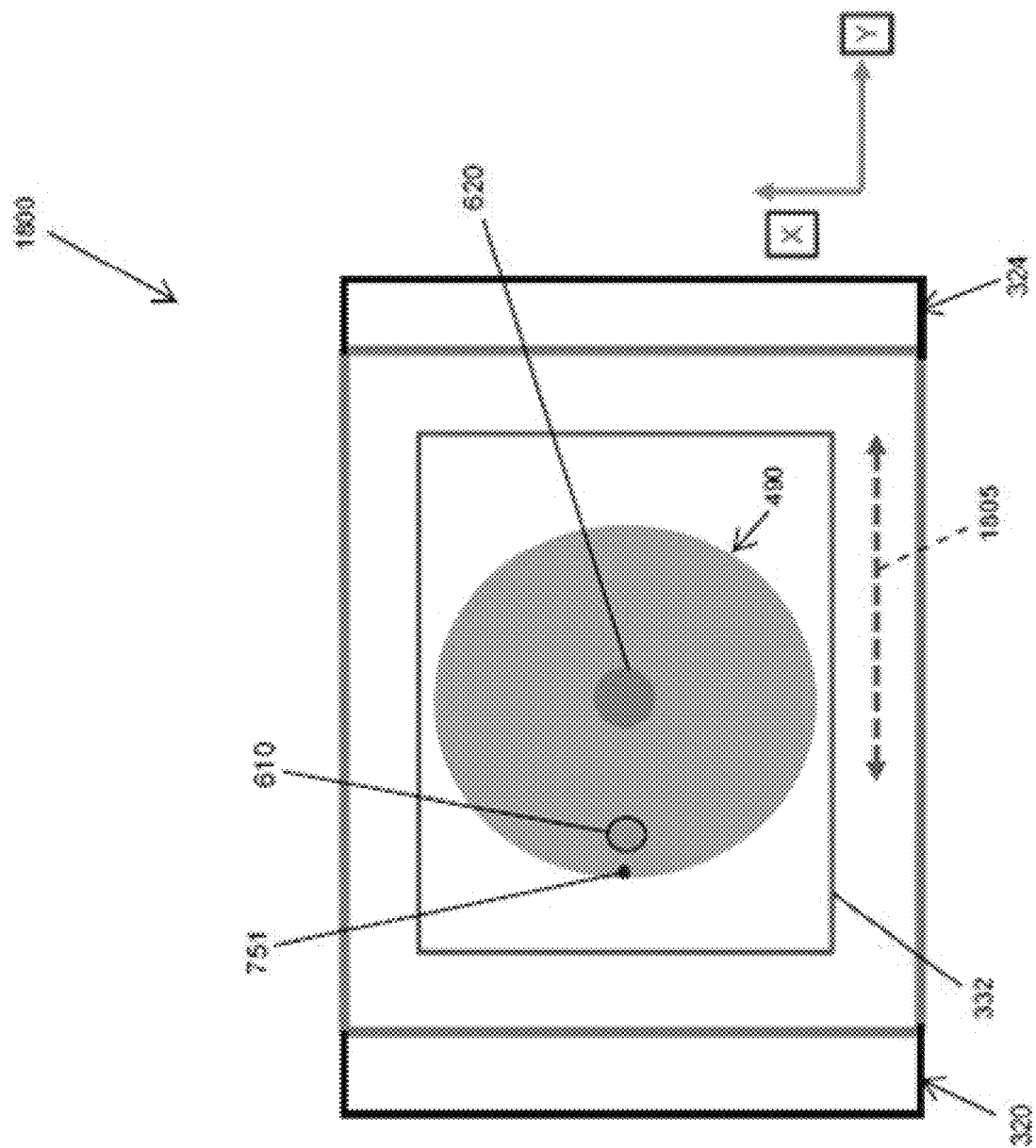

The method continues as shown in FIG. 18 with step 1800 that includes moving 1805 the lamp bank in the "Y" direction with the fiber sensor 750 operating until the edge of the wafer 490 is located by the fiber sensor 750. In practice, the fiber sensor 750 may be configured to operate so as to trigger a light when the wafer edge is seen (below the fiber optic sensor 750 at spot 751) because of the reflectivity principle. The movement 1805 is halted, and the lamp bank 332 may be secured in this X location. The method may then continue with removing the jig 760 and installing the mounting assembly 330 on the lamp bank 332, including attaching the mounting stands 342, 344, 346 and pyrometers 350, 354, 358 of the temperature monitoring assembly 330 onto the lamp bank 332, thereby positioning the edge pyrometer 358 in a position where its received signal will be aligned with (and received from) an edge of a wafer 490 placed in the reaction chamber 311 below the lamp bank 332 on the susceptor 314 such as with spot 610 reading at R145 mm on the substrate (or a developing film thereon).

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. Further, in some instances, well-known structures, materials, or operations are not shown or described in detail to avoid obscuring aspects of the subject matter of the present disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A method of assembling a reactor system adapted for monitoring edge wafer temperatures, comprising:
    placing a lamp bank, operable to provide heat to an inner chamber of a reaction chamber, on a lid adapted for supporting the lamp bank relative to the reaction chamber;
    mounting an alignment jig on an upper surface of the lamp bank at a location predefined for an edge pyrometer of a temperature monitoring assembly operable to perform the monitoring of the edge wafer temperatures;
    placing an edge sensor, operable to sense an edge of a wafer positioned on a susceptor in the inner chamber, in the alignment jig;
    moving the lamp bank linearly relative to the lid, with the edge sensor operating, until an edge of the wafer is identified; and
    securing the lamp bank to the lid.

2. The method of claim 1, wherein the edge sensor comprises a fiber optic sensor and wherein the edge of the wafer is identified based on a difference in reflectivity of the wafer and the susceptor.

3. The method of claim 1, further comprising removing the alignment jig from the lamp bank and replacing the alignment jig with the temperature monitoring assembly with the edge pyrometer positioned at the location predefined for the edge pyrometer.

4. The method of claim 3, wherein the lamp bank comprises a transmission channel at the location predefined for the edge pyrometer for transmitting a signal from the wafer on the susceptor through the inner chamber and the lamp bank to the edge pyrometer and wherein the alignment jig includes a slot for receiving the edge sensor that is offset a predefined distance from the transmission channel when the alignment jig is mounted on the upper surface of the lamp bank at the location predefined for the edge pyrometer.

5. The method of claim 4, wherein the upper surface of the lamp bank includes a pair of alignment holes on opposite sides of the transmission channel, wherein the jig comprises a body with a bottom surface for mating with the upper surface of the lamp bank, wherein the alignment jig includes a pair of alignment pins sized and positioned for insertion into the alignment holes on the lamp bank, and wherein the lamp bank further includes a second transmission channel with a center offset the predefined distance from the transmission channel, whereby a signal from the edge sensor is received from the inner chamber and through the lamp bank.

6. The method of claim 4, wherein the predefined distance is in the range of 2 to 10 millimeters.

7. The method of claim 1, wherein the placing of the lamp bank comprises positioning the lamp bank equidistantly from inner edges of the lid along an axis that is orthogonal to an axis along which the lamp bank is moved during the moving of the lamp bank linearly relative to the lid.

8. A reactor system adapted for monitoring edge wafer temperatures, comprising:
    a reaction chamber;
    a lid for supporting heat lamps relative to the reaction chamber;
    a lamp bank positionable on the lid in a plurality of positions along a longitudinal axis;
    an alignment jig mounted upon an upper surface of the lamp bank at a location predefined for an edge pyrometer of a temperature monitoring assembly operable to perform the monitoring of the edge wafer temperatures, wherein the lamp bank includes a first transmission channel at the location predefined for the edge pyrometer for receiving a signal from within the reaction chamber at the edge pyrometer; and
    an edge sensor, operable to sense an edge of a wafer positioned on a susceptor in the reaction chamber, supported in a slot of the alignment jig,
    wherein the edge sensor is oriented by the slot in the alignment jig to receive a signal through a second transmission channel, offset a predefined distance from the first transmission channel, in the lamp bank into the reaction chamber.

9. The reactor system of claim 8, wherein, during assembly of the reactor system, the lamp bank is linearly movable between two or more of the plurality of positions with the edge sensor operating until the edge sensor identifies the edge of the wafer.

10. The reactor system of claim 9, wherein the edge sensor comprises a fiber optic sensor and wherein the edge of the wafer is identified based on a difference in reflectivity of the wafer and the susceptor.

11. The reactor system of claim 8, wherein the upper surface of the lamp bank includes a pair of alignment holes on opposite sides of the first transmission channel, wherein the jig comprises a body with a bottom surface for mating with the upper surface of the lamp bank, wherein the jig includes a pair of alignment pins sized and positioned for insertion into the alignment holes on the lamp bank, whereby the signal to the edge sensor is transmitted from the inner chamber through the lamp bank during operations of the edge sensor.

12. The reactor system of claim 8, wherein the predefined distance is in the range of 2 to 10 millimeters.

13. The reactor system of claim 8, further comprising, with the alignment jig removed from the lamp bank, the temperature monitoring assembly including a mounting stand supporting the edge pyrometer on the upper surface of the lamp bank with the edge pyrometer at the predefined location for the edge pyrometer, whereby a signal to the edge pyrometer is transmitted through the first transmission channel of the lamp bank from a spot on the wafer proximate to the edge of the wafer.

14. The reactor system of claim 13, wherein the spot has an outer diameter in the range of 2 to 10 millimeters.

15. The reactor system of claim 14, wherein the mounting stand is configured to define a lens of the edge pyrometer with a length greater than a length of a lens of a center pyrometer of the temperature monitoring assembly to define a size of the spot and wherein an outlet of the first transmission channel acts as a signal clipping aperture for the signal received at the edge pyrometer to further define the size of the spot.

16. The reactor system of claim 15, wherein the center pyrometer senses a temperature of the wafer at a center location of the wafer with a spot having an outer diameter greater than the spot of the edge pyrometer, whereby temperatures of the wafer are concurrently monitored at two or more locations.

17. An alignment jig adapted for aligning an edge pyrometer with a wafer edge in a reactor system, comprising:
a body;
a slot extending through the body for receiving a fiber optic sensor; and
a pair of alignment pins on a surface of the body, wherein the pair of alignment pins are spaced apart a distance matching a spacing distance between alignment holes on a surface of a lamp bank at a location for an edge pyrometer,
wherein a center axis of the slot is offset a predefined distance from a location between the pair of alignment pins associated with a transmission channel in the lamp bank configured to transmit a signal from the edge pyrometer.

18. The alignment jig of claim 17, wherein the predefined distance is in the range of 2 to 10 millimeters.

19. The alignment jig of claim 17, further comprising a clamp for fastening the fiber optic sensor to the body.

20. The alignment jig of claim 17, further comprising a pair of holes in the body for receiving a pair of fasteners at spaced apart locations matching a spacing between a pair of threaded holes in the surface of the lamp bank provided for fastening a mounting stand for the edge pyrometer to the lamp bank.

* * * * *